United States Patent
Cooper et al.

(10) Patent No.: US 7,202,682 B2
(45) Date of Patent: Apr. 10, 2007

(54) COMPOSITE MOTION PROBING

(75) Inventors: Timothy E. Cooper, Discovery Bay, CA (US); Benjamin N. Eldridge, Danville, CA (US); Igor Y. Khandros, Orinda, CA (US); Rod Martens, Livermore, CA (US); Gaetan L. Mathieu, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 395 days.

(21) Appl. No.: 10/328,113

(22) Filed: Dec. 20, 2002

(65) Prior Publication Data

US 2004/0130312 A1 Jul. 8, 2004

(51) Int. Cl.
*G01R 31/02* (2006.01)
(52) U.S. Cl. .................................................. 324/756
(58) Field of Classification Search .............. 324/158.1, 324/754, 756, 758, 759, 761, 762, 724
See application file for complete search history.

(56) References Cited

U.S. PATENT DOCUMENTS

| | | | |
|---|---|---|---|
| 4,506,215 A * | 3/1985 | Coughlin | ................... 324/761 |
| 5,436,571 A | 7/1995 | Karasawa | |
| 5,773,987 A | 6/1998 | Montoya | |
| 5,974,662 A | 11/1999 | Eldridge et al. | |
| 6,297,656 B1 | 10/2001 | Kobayashi et al. | |
| 6,788,086 B2 * | 9/2004 | Hantschel et al. | .......... 324/762 |
| 2004/0201392 A1 | 10/2004 | Kim et al. | |
| 2005/0179455 A1 | 8/2005 | Cooper et al. | |

FOREIGN PATENT DOCUMENTS

| DE | 19733861 A | 2/1999 |
|---|---|---|
| EP | 046091 A | 12/1991 |
| JP | 11074322 A | 3/1999 |

* cited by examiner

*Primary Examiner*—Ha Tran Nguyen
*Assistant Examiner*—Trung Q. Nguyen
(74) *Attorney, Agent, or Firm*—N. Kenneth Burrastor

(57) ABSTRACT

An electronic device is moved into a first position with respect to probes for making electrical contact with the device. The electronic device is then moved into a second position in which the electronic device is pressed against the probes, compressing the probes. The movement into the second position includes two components. One component of the movement tends to press the electronic device against the probes, compressing the probes and inducing a stress in the probes. The second movement tends to reduce that stress. Test data are then communicated to and from the electronic device through the probes.

23 Claims, 16 Drawing Sheets

US 7,202,682 B2

COMPOSITE MOTION PROBING

FIELD OF THE INVENTION

This invention relates generally to probing an electronic device.

BACKGROUND OF THE INVENTION

Although the present invention is generally applicable to probing any electronic device, the present invention is particularly suited for probing an integrated circuit to test the circuit. As is known, integrated circuits are typically manufactured as a plurality of dice on a semiconductor wafer. FIG. 1 illustrates a typical test system 100 for testing such a semiconductor wafer 124. The exemplary test system shown in FIG. 1, includes a tester 102, a test head 118, a probe card 106, and a prober 120.

A semiconductor wafer 124 is placed on a chuck (also commonly referred to as a stage) 114, which typically is capable of movement in the "x," "y," and "z" directions. The chuck 114 may also be capable of being rotated and tilted and may be further capable of other motions as well. Once the semiconductor wafer 124 is placed on the chuck 114, the chuck is typically moved in the "x," "y" directions so that terminals on the dice (not shown) of the wafer 124 align with probes 108 on the probe card 106. The chuck 114 then typically moves the wafer 124 upward in the "z" direction, bringing the terminals into contact with the probes 108. One or more cameras 122 may aid in aligning the terminals and the probes and determining contact between the probes 108 and the terminals.

Once the terminals of the dice (not shown) are in contact with the probes 108, a tester 102, which may be a computer, generates test data. The test data is communicated through one or more communication links 104 to a test head 118. The test data is communicated from the test head 118 through interconnections 116 (e.g., pogo pins) to the probe card 106 and finally to the terminals of the dice (not shown) through probes 108. Response data generated by the dice are communicated in reverse direction from the probes 108, through the probe card 106, through interconnections 116, through the probe head 118, through a communication link 104, to the tester 102.

FIGS. 2A–2C illustrate movement of the wafer 124 into contact with the probe card 106. As mentioned above and shown in FIG. 2A, terminals 204 of one or more dice 202a of wafer 124 are aligned with probes 108 of the probe card 106. The chuck 114 them moves the wafer upward such that the terminals 204 of the die 202a contact probes 108, as shown in FIG. 2B. As shown in FIG. 2C, the chuck 114 typically moves the wafer 124 beyond first contact with the terminals 204. (Movement beyond first contact is often referred to as "over travel.") This typically compresses the probes 108. The resulting spring force exerted by the probes 108 against the terminals 204 helps to create a reasonably low resistance electrical connection between the probes and the terminals. In addition, the probes 108 often wipe across the surface of the terminals 204 as the probes are being compressed. The wiping action tends to cause the tips of the probes 108 to break through any oxide or other build up on the terminals 204, again helping to create a reasonably low resistance electrical connection between the probes and the terminals.

FIG. 3A illustrates over travel and the resulting compression and wipe of an exemplary probe 108 of probe card 106. While at a position representing first contact between the probe and the wafer, the probe, wafer, and terminal are labeled 108a, 124a, and 204a, respectively, and shown in dashed lines in FIG. 3A. While at a position representing over travel by a distance 304, the probe, wafer, and terminal are labeled 108b, 124b, and 204b, respectively, and shown in solid lines in FIG. 3A. The wipe of the tip of the probe 108 across the terminals 204 is labeled 302 in FIG. 3A.

As might be expected, compression of the probe 108 due to over travel induces forces and stresses in the probe. The types and locations of the forces and stresses depend on, among other things, the shape and design of the probe. A few exemplary forces and stresses induced in the probe 108 illustrated in FIG. 3A are shown in FIG. 3B. A principal stress is produced by a torque or rotational force 306b about the point at which the probe 108 is secured to the probe card 106. Of course many other forces and stresses may be induced in the probe. The spring force of the probe 108 may also exert a force 310b against the terminal (not shown in FIG. 3B) of the wafer.

Such forces and stresses may break, damage, or reduce the useful life of a probe 108. Also, the force 310b exerted by the probe 108 against the terminal may damage the terminal and/or the wafer. A wafer comprising material with a low "k" dielectric may be particularly susceptible to such damage. Generally speaking, the greater the friction between a probe 108 and a terminal 204, the greater such forces and stresses are likely to be. Indeed, it is possible for frictional forces to prematurely stop the wiping of the probe 108 tip across the terminal 204. This may happen, for example, if the probe 108 tip digs too deeply into the terminal 204 or if the probe tip gets caught in an irregularity on the surface of the terminal. If the probe 108 tip stops its wiping motion prematurely, the forces and stresses that build up on the probe may become particularly large (and therefore particularly likely to cause damage to the probe, terminal, and/or wafer). Although a probe 108 may dig into any type of terminal 204, a probe 108 is particularly susceptible to digging into a terminal made of a soft material (e.g., solder ball terminals) or a terminal with a rough surface (e.g., copper terminals).

FIG. 3C illustrates in dashed lines the position of a probe 108a while at initial contact with the terminal (not shown in FIG. 3C). (This is similar to the position labeled 108a in FIG. 3A.) Also, in dashed lines in FIG. 3C is the position 108b of the probe after over travel, which is similar to position 108b shown in FIG. 3C. In FIG. 3C, however, a position and compression of the probe where the tip dug into the terminal and stopped part way through its wiping motion is also illustrated and labeled 108c (and in solid lines). As can be seen, the probe is more deformed in position 108c than in position 108b (its position had it not dug into the terminal). Consequently, the forces and stresses 306c, 310c such as those shown in FIG. 3B, may be significantly greater in position 108c than in position 108b.

SUMMARY OF THE INVENTION

This invention relates generally to probing an electronic device and is particularly applicable to probing a semiconductor device to test the device. An electronic device is moved into a first position with respect to probes for making electrical contact with the device. The electronic device is then moved into a second position in which the electronic device is pressed against the probes, compressing the probes. The movement into the second position includes two components. One component of the movement tends to press the electronic device against the probes, compressing the probes and inducing a stress in the probes. The second movement tends to reduce that stress or modify and reorient the forces between the probe and the wafer. Test data are then communicated to and from the electronic device through the probes.

DETAILED DESCRIPTION OF EMBODIMENTS OF THE INVENTION

The present invention relates to probing an electronic device. This specification describes exemplary embodiments and applications of the invention. The invention, however, is not limited to these exemplary embodiments and applications or to the manner in which the exemplary embodiments and applications operate or are described herein.

Figure 4:
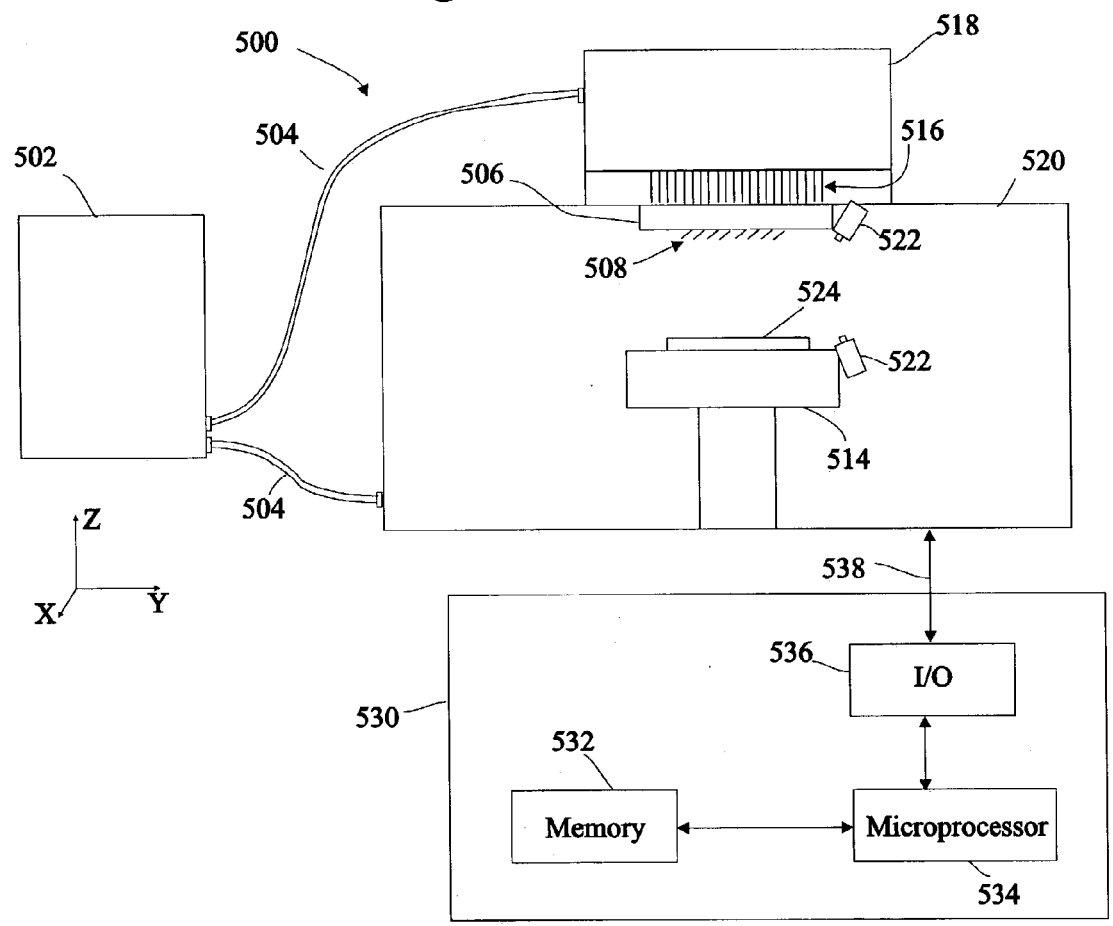
FIG. 4 illustrates an exemplary test system.

FIG. 4 illustrates an exemplary semiconductor test system 500. Test system 500 is exemplary only; other systems in which any type of probe is brought into contact with another device may be used. Nonexclusive examples of such systems include sockets for testing packaged or unpackaged semiconductor devices, or any type of test system in which a semiconductor device (packaged or unpackaged, singulated or unsingulated) is probed. Of course, even if a semiconductor wafer test system is used, a semiconductor test system that is different than the exemplary test system 500 shown in FIG. 4 may be used.

Figure 1:
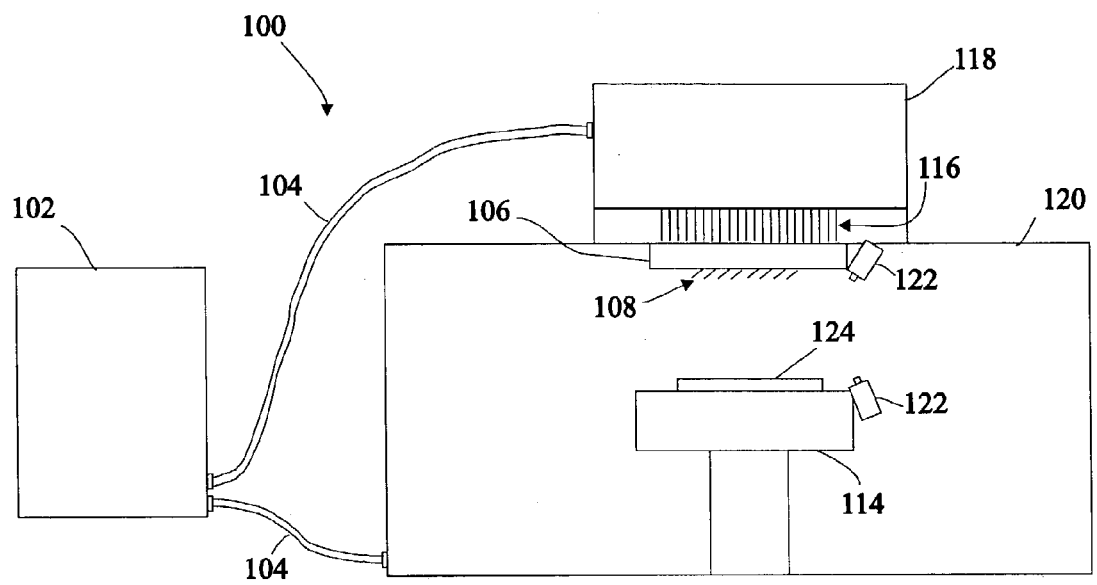
FIG. 1 illustrates an exemplary prior art semiconductor test system.
Figure 1:
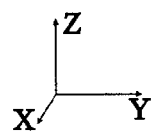

The exemplary semiconductor test system 500 illustrated in FIG. 4 is generally similar to the test system 100 shown in FIG. 1. That is, exemplary test system 500 includes a tester 502, one or more communication links 504, a prober 520, a test head 518, a probe card 506, and interconnections 516 between the probe card and the test head, all of which may be generally similar to like elements as described with respect to FIG. 1. The prober 520 may include a variety of elements such as one or more cameras 522, which, may be generally similar to the cameras 122 illustrated in FIG. 1.

Probe card 506 may be any type of probe card, including without limitation a probe card 506 assembly as illustrated in U.S. Pat. No. 5,974,662, which is incorporated by reference herein in its entirety. Probes 508 may be any type of probes, including without limitation needle probes, buckling beam probes (e.g., "COBRA" probes), bumps, posts, and spring probes. Nonexclusive examples of spring probes include the spring contacts described in pending U.S. patent application Ser. No. 09/364,788 (filed Jul. 30, 1999); U.S. Pat. Nos. 5,917,707, 6,255,126, and 6,475,822; and U.S. Patent Application Publication No. 2002/0019152 A1.

As shown in FIG. 4, the test system 500 also includes a controller 530 for controlling movement of the chuck 514. For convenience purposes (and not by way of limitation), directions in FIG. 5 are identified using an "x," "y," and "z" coordinate system in which the "z" direction is the vertical (up or down) with respect to FIG. 5, the "x" direction is horizontally into or out of the page, and the "y" direction is also horizontal but to the right or left in FIG. 4.

The controller 530 may be any suitable controller for controlling movement of the chuck 514. The controller 530 illustrated in FIG. 4 is a microprocessor based controller. As shown, controller 530 includes a digital memory 532, a microprocessor 534, input/output electronics 536, and input/output port 538. The digital memory 532 may be any type of memory including an electronic memory, an optical memory, a magnetic memory, or some combination of the foregoing. As just two examples, digital memory 532 may be a read only memory, or digital memory 532 may be a combination of a magnetic or optical disk and a random access memory. Microprocessor 534 executes instructions (e.g., software or microcode) stored in digital memory 532, and input/output electronics 536 controls input and output of electrical signals into and out of controller 530. Input data is received and output data is output via port 538. Control signals for controlling movement of chuck 514 are among data output via port 538. As will be seen, such software or microcode may be configured to control the chuck movements described herein Controller 530 may be a stand alone entity as illustrated in FIG. 4. Alternatively, controller 530 may be contained within the prober 520. Indeed, a typical prober includes a microprocessor based control system for moving chuck 514, and controller 530 may comprise such an existing control system configured with software or microcode to execute the chuck movements described herein. Of course, the controller 530 may be located in other elements of system 500 or may be distributed among one or more elements of system 500.

The controller 530, however, need not be microprocessor based. Indeed, any system for controlling movements of chuck 514 may be used. In fact, controller 530 may comprise manual mechanisms by which an operator manually moves the chuck 514.

Figure 5:
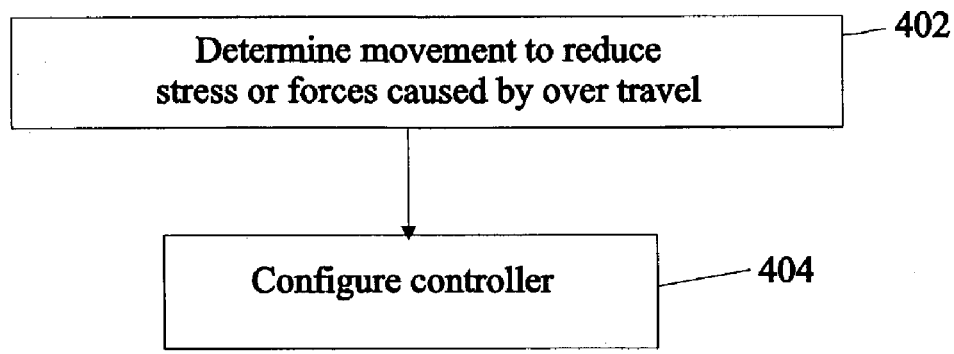
FIG. 5 illustrates an exemplary process for configuring the test system of FIG. 4.

FIG. 5 illustrates an exemplary process for preparing the test system 500. As shown, the first step 402 in the exemplary process is to determine a movement of the chuck 514 that will reduce stress in the probes 508 and/or forces on the wafer 524 caused by the over travel. Because the over travel movement is typically in the upward "z" (that is, vertical) direction (with respect to the orientation shown in FIG. 4), step 402 typically involves determining an "x" and/or "y"

(that is, horizontal) movement component to add to the over travel movement, creating a composite movement that combines both the vertical over travel component and a horizontal component. Preferably, the composite movement is coordinated, that is, a length of the horizontal movement is a function of a length of the vertical movement. Any mathematical function relationship between the horizontal component and the vertical component may be used. For example, the functional relationship may be linear, nonlinear, stepped, logarithmic, etc. Whether or not the composite movement is coordinated, there are any number of ways to determine a horizontal movement component that will reduce stress or forces in probes 508 or on wafer 524 (the terms "stress" and "force" being used interchangeably to refer to stresses or forces on the probes or the wafer) during over travel.

One way of determining a horizontal movement component that will reduce stress in probes 508 or on the wafer 524 caused by vertical over travel is to determine the direction and optionally the length of the natural wipe of a probe caused by vertical over travel. Typically, a horizontal movement of the chuck in the direction of the wipe will reduce stress or contact forces caused by vertical over travel. The length of the horizontal movement may be more, less, or the same as the length of the wipe. Generally speaking, the closer the length of the horizontal movement is to the length of the wipe, the greater the reduction in stresses. It should be apparent that a horizontal movement that is shorter than the wipe induced by the vertical over travel will result in a smaller actual wipe. Likewise, a horizontal movement that is longer than the wipe induced by the vertical over travel will result in a reverse actual wipe. Of course, the length of the horizontal movement should not be so much greater or less than the wipe induced by the vertical over travel so as to cause the probe to wipe off of the terminal. A horizontal movement that is the same length as the wipe induced by vertical movement will, at least theoretically, result in no actual wipe, although some rocking back and forth of the probe tip is likely to occur, which may cause the tip to break through oxide or other contaminates on the surface of the terminal.

Figure 6:
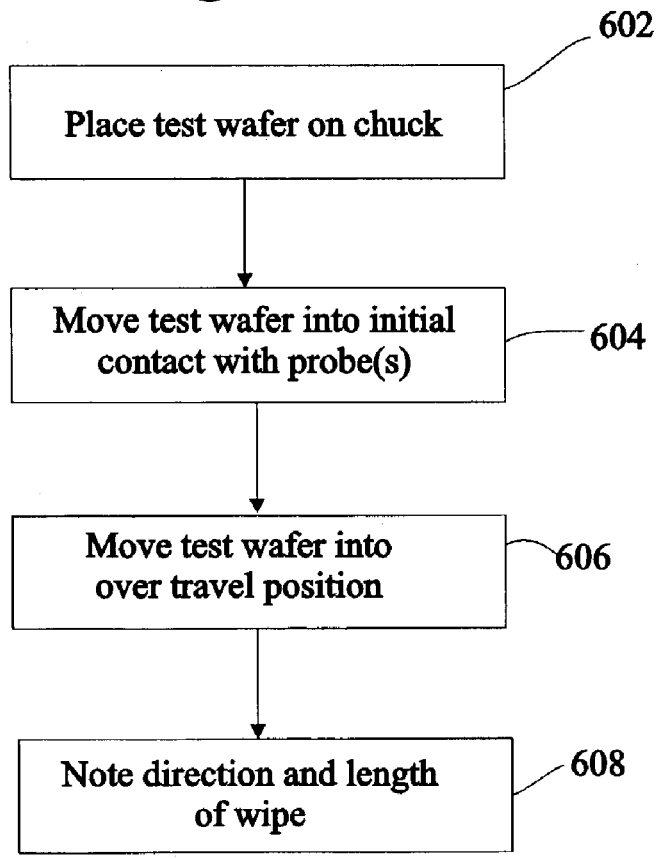
FIG. 6 illustrates an exemplary process for implementing step 402 of FIG. 5.
Figure 7A:
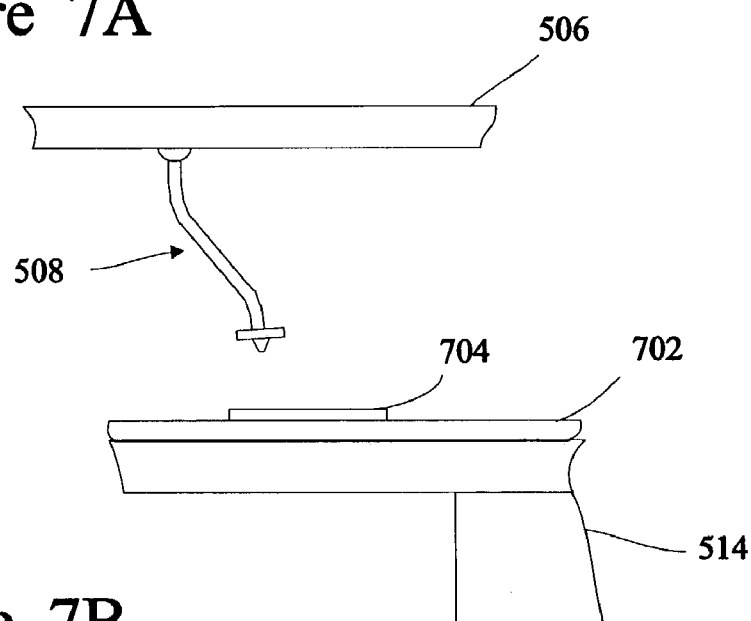
FIGS. 7A–7C illustrate an exemplary application of the process of FIG. 6.
Figure 7B:
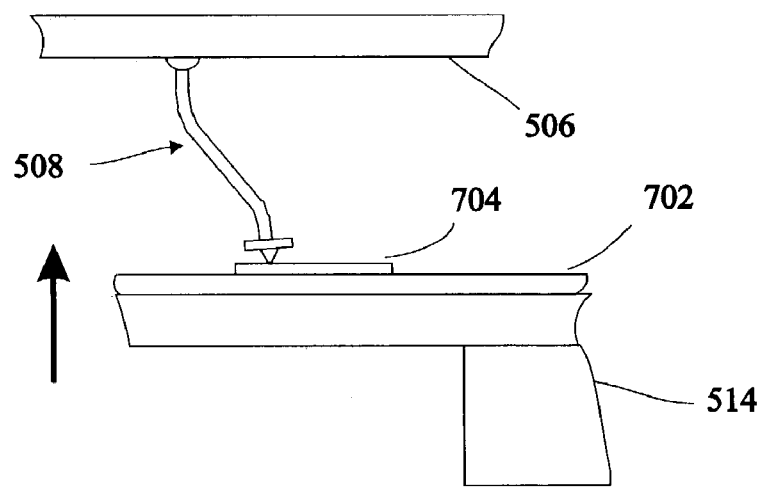
Figure 7C:
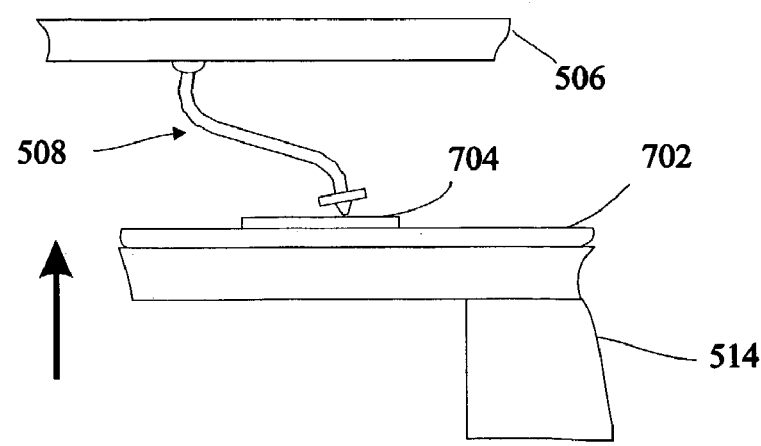

FIGS. 6–7C illustrate a first exemplary way of determining the direction and length of wipe caused by vertical over travel. As will be seen, it utilizes a test system like the test system 500 shown in FIG. 4. Per step 602 of FIG. 6, and as shown in FIG. 7A, a test wafer 702 is placed on chuck 514 (for simplicity, only a portion of probe card 506, test wafer 702, and chuck 514 are shown in FIGS. 7A–7C). The test wafer 702 includes terminals 704 (only one is shown for simplicity), which preferably have low friction surfaces. Per step 604, and as shown in FIG. 7B, the chuck 514 then moves the test wafer 702 vertically upward in the "z" direction so that terminal 704 makes contact with probe 508. Per step 606, and as shown in FIG. 7C, the chuck 514 continues to move the test wafer 702 upward, over traveling the terminal 704 with respect to the probe 508. Preferably, the distance of the over travel is the same as or at least similar to the distance of over travel a production wafer to be tested by probe card 506 will be driven during actual testing of production wafers. Per step 608, the direction and length of the wipe of probe 508 across terminal 704 caused by the over travel is noted. As noted above, the surface of the terminals 704 are preferably low friction so that the wipe is as close to a true or frictionless wipe as possible. The direction and length of wipe may be noted visually by an operator. Alternatively, terminal 704 may be made of a material that is readily marked so that the wipe of probe 508 is scratched or otherwise marked on the surface of the terminal.

Figure 8A:
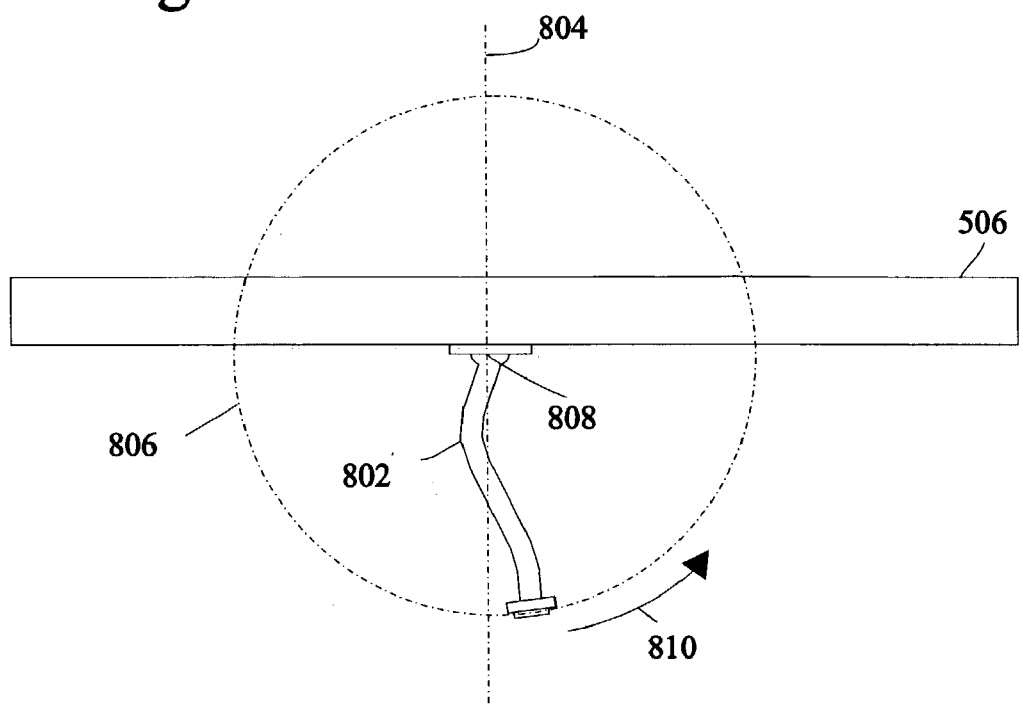
FIGS. 8A and 8B illustrate an exemplary application of step 402 of FIG. 5.
Figure 8B:
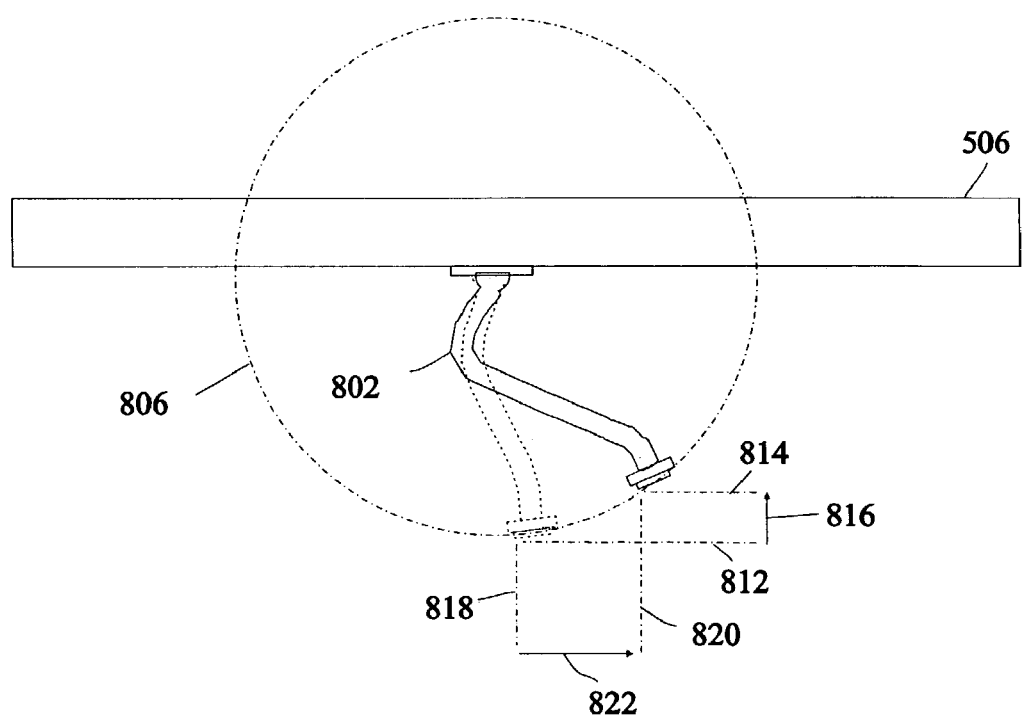

FIGS. 8A–8B illustrate a second exemplary way of determining the direction and length of wipe caused by vertical over travel. As will be seen, this second way does not use equipment. Rather, an engineer examines the structure and shape of probe 802 and, using laws of mathematics and physics, estimates the direction and length of wipe of the probe across a terminal that is likely to be induced by over traveling a terminal on a production wafer against the probe. Stresses in the probe 802 or on the wafer may also be estimated using physical modeling and mathematical calculations.

In FIGS. 8A and 8B, the direction and length of wipe for probe 802 with an "S" shape is illustrated. As shown, an imaginary line 804 and imaginary circle 806 are used as aids to estimating wipe. The imaginary line 804 is perpendicular to the surface to which probe 802 is attached to probe card 506, and line 804 passes through the point 808 where probe 802 is attached to probe card 506. The imaginary circle 806 is centered at attachment point 808. As a terminal of a wafer (not shown in FIGS. 8A and 8B) is brought into contact with probe 802 and then over traveled, the tip of probe 802 will tend to travel along the imaginary circle in a direction away from imaginary line 804, as shown in FIG. 8A by arrow 810. Thus, the direction of wipe for the probe 802 shown in FIG. 8A is to the right.

FIG. 8B illustrates estimating the length of the wipe. The length of the wipe depends on the amount of over travel. As shown in FIG. 8B, the length of wipe for a given amount of over travel may be estimated by marking the beginning and end of over travel 816 with two horizontal lines 812, 814. The length of the wipe 822 caused by the over travel 816 is then the distance between two vertical lines 818, 820 that pass through points on imaginary circle 806 where horizontal lines 812 and 814 also pass through the circle.

Figure 9A:
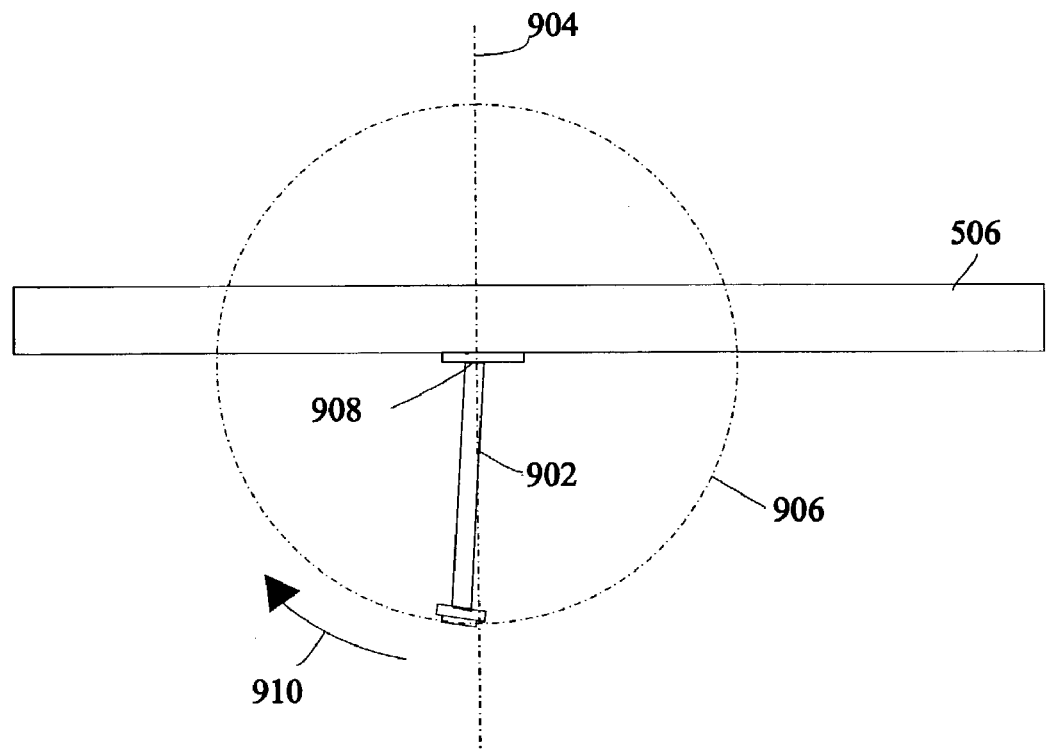
FIGS. 9A and 9B illustrate another exemplary application of step 402 of FIG. 5.
Figure 9B:
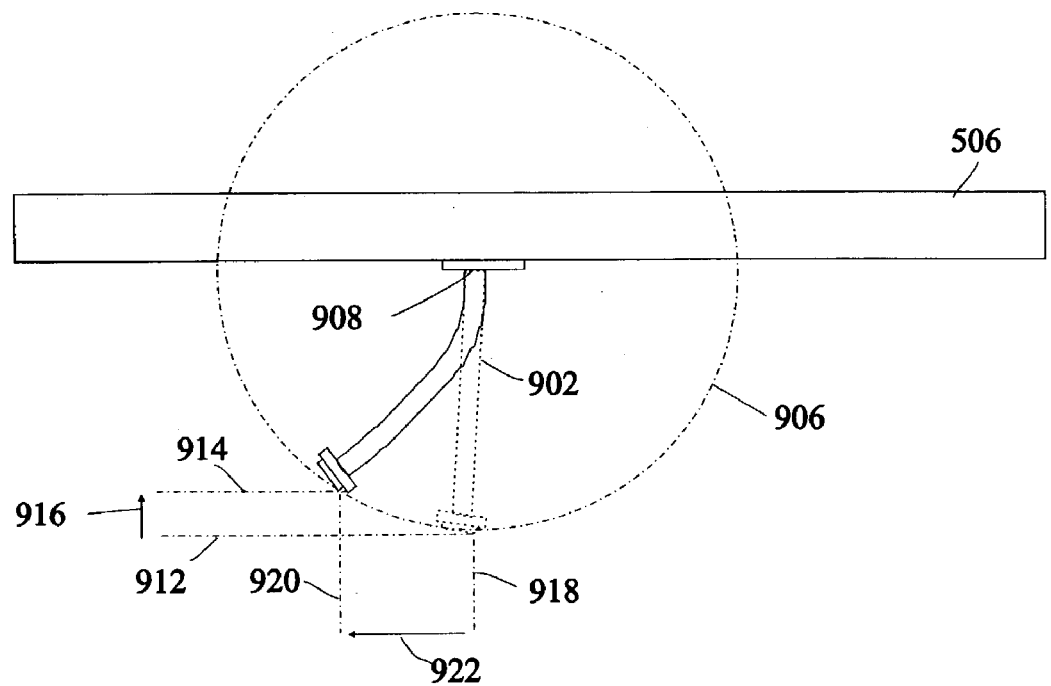

FIGS. 9A and 9B illustrate application of the estimating procedure discussed above with respect to FIGS. 8A and 8B to a differently shaped and oriented probe 902. As shown in FIG. 9A, bringing a wafer terminal (not shown in FIGS. 9A and 9B) into contact with the probe 902 and then over traveling will tend to cause the tip of probe 902 to rotate about imaginary circle 906 away from imaginary line 904. Thus, the direction of the wiping motion of probe 902 will be to the left in FIG. 9A as shown by arrow 910. As shown in FIG. 9B, the length 922 of the wipe for a given over travel distance 916 is the distance between vertical lines 918 and 920. Similar to FIG. 8B, horizontal lines 912 and 914 represent the beginning and end of over travel distance 916. Vertical lines 918 and 920 intersect imaginary circle 906 at points where horizontal lines 912 and 914 also intersect imaginary circle 906.

Of course, other mathematical and modeling methods may be used to determine a movement component to reduce stress or forces (step 402). For example, finite element modeling may be used. It should be noted that, generally speaking, the contact resistance between a probe and a terminal on the wafer to be tested should be less than a predetermined level, which level typically depends on the particular wafer. Thus, some level of force or stress with respect to the probes and the terminals of the wafer typically must be present to obtain an acceptable contact resistance between the probe and the terminal. Once a horizontal movement component is determined using a method such as those illustrated in FIGS. 6–9B, further testing may be necessary in order to verify that the achieved contact resistance is acceptable.

Figure 10:
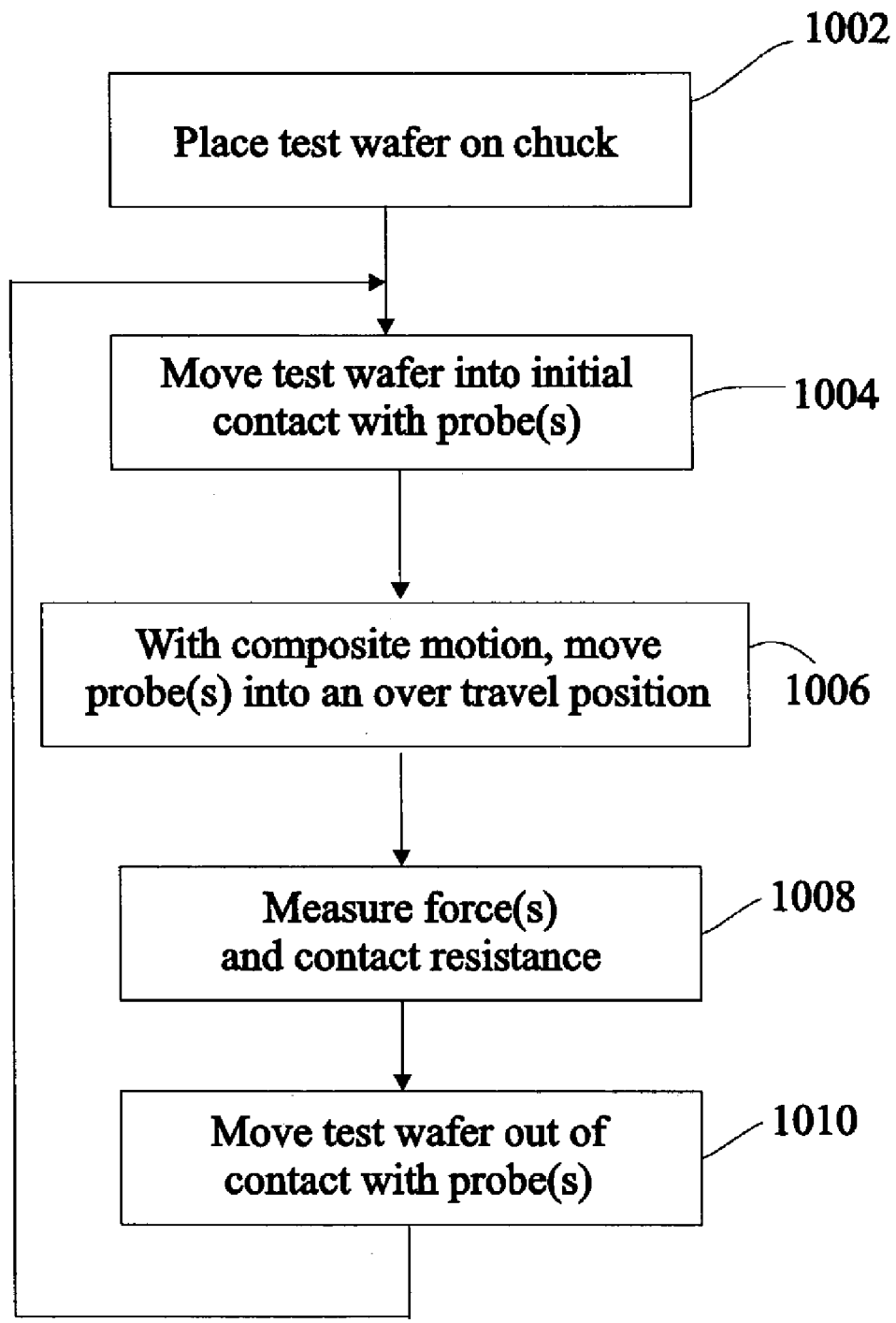
FIG. 10 illustrates another exemplary process for implementing step 402 of FIG. 5.
Figure 11A:
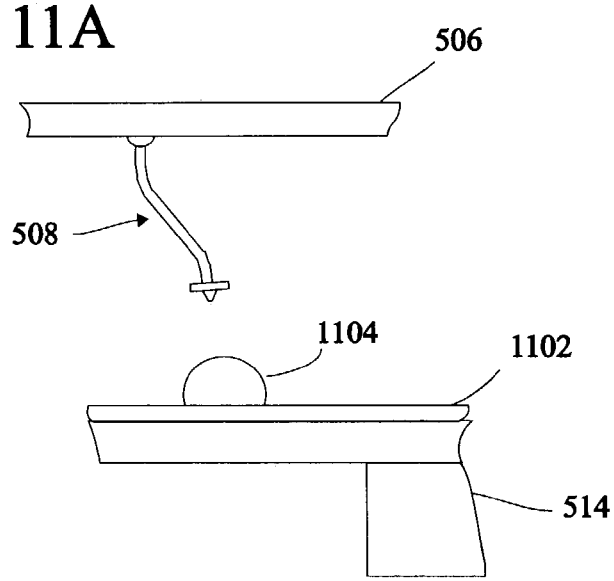
FIGS. 11A–11C illustrate an exemplary application of the process of FIG. 10.
Figure 11B:
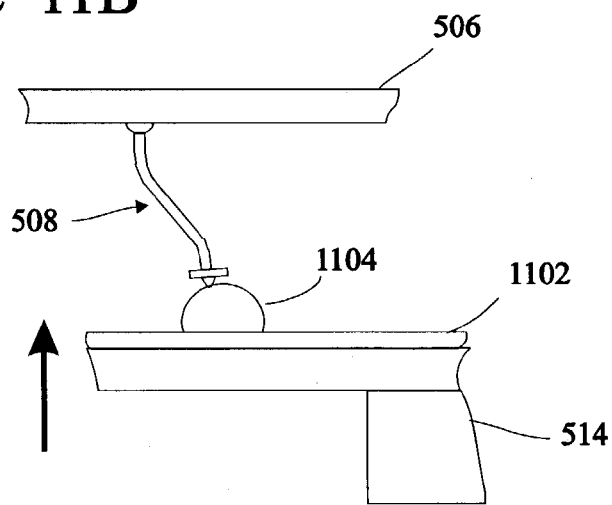
Figure 11C:
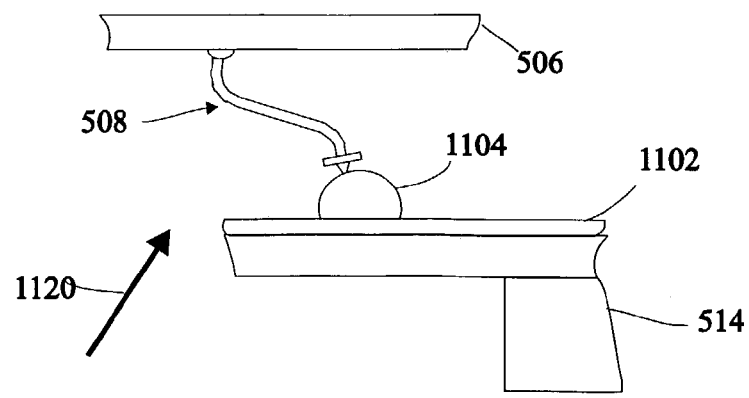

FIGS. 10–11C illustrate another way of determining a horizontal movement component (step 402 of FIG. 5) to reduce stress in the probes and forces on the wafer caused by vertical over travel. A test system, such as test system 500 shown in FIG. 4, is again used. Per step 1002 of FIG. 10, and as shown in FIG. 11A, a test wafer 1102 is placed on chuck 514. (Again for simplicity, only a portion of probe card 506, test wafer 1102, and chuck 514 are shown in FIGS. 11A–11C.) Test wafer 1102 preferably includes terminals 1104 that are the same as or similar to the terminals on the production wafers to be tested by test system 500. By way of example, solder-ball-type terminals 1104 are illustrated on the test wafer 1102. Strain or stress gauges (not shown) or other means for measuring or estimating stresses or forces may be placed on the probe card 506 and/or the test wafer 1102. For example, a strain or stress gauge may be placed so as to measure directly or indirectly one or more stresses induced in the probe 508 or the test wafer 1102. A resistance measuring device (not shown) is included for measuring the electrical resistance of the contact between a probe and a terminal of the test wafer. Many resistance measuring devices are known, and any such device may be used. Per step 1004, and as shown in FIG. 11B, the chuck 514 then moves the test wafer 1102 vertically upward in the "z" direction so that terminal 904 makes contact with probe 508. Per step 1006, and as shown in FIG. 11C, the chuck 514 then moves the test wafer 1102 in a composite motion that includes both a vertical component and a horizontal component. The vertical component is preferably the amount of vertical over travel a production wafer to be tested by probe card 506 will be driven during actual testing of production wafers. The horizontal component of the composite motion is a trial movement selected to reduce stress in the probe 508. The direction and length of the horizontal component may be selected in any manner, including without limitation randomly, as an incremental change from a previously selected horizontal component, or as a horizontal component determined using another method, such as one of the methods illustrated in FIGS. 6–7C or FIGS. 8A and 9B.

Referring again to FIG. 10, the next step 1008 is to note the stress and/or forces measured by the strain or stress gauges, and to also note the contact resistance (the resistance of the connection between the probe 508 and the terminal 1104. Then, the test wafer 1102 is moved out of contact with probe 508, and steps 1004 through 1010 are repeated one or more times. Each time steps 1004 through 1010 are repeated, step 1006 is performed with a different horizontal movement component. Steps 1004 through 1010 may be repeated a selected number of times, after which a horizontal movement component that produced an acceptably low stress or force and an acceptably low contact resistance (as measured at step 1008) is selected in step 402 of FIG. 4 as the movement determined to reduce stress caused by over travel. As another example, steps 1004 through 1010 may be repeated until both an acceptably low stress and/or force and an acceptably low contact resistance are measured at step 1008. Of course, the horizontal movement may be selected to optimize one or the other of low stress/force or low contact resistance.

Of course, strain or stress gauges may be dispensed with in the process shown in FIGS. 10–11C. If strain or stress gauges are not used, at step 1008, an operator may simply observe and note the compression of probe 508, and after repeated execution of steps 1004–1010, select the horizontal movement component from step 1006 that produced a compression of probe 508 that appears to the operator to be acceptable.

Referring again to FIG. 5, the next step 404 is to configure controller 530 to add the horizontal movement determined in step 402 to the vertical over travel movement of the chuck, creating the composite vertical and horizontal movement during over travel referred to above. One exemplary way of implementing step 404 is to prepare software or microcode for generating control signals to control movements of chuck 514 and to load such software into digital memory 532 of FIG. 4.

After completing steps 402 and 404 of FIG. 5, test system 500 is ready to begin testing production wafers 524.

Figure 12:
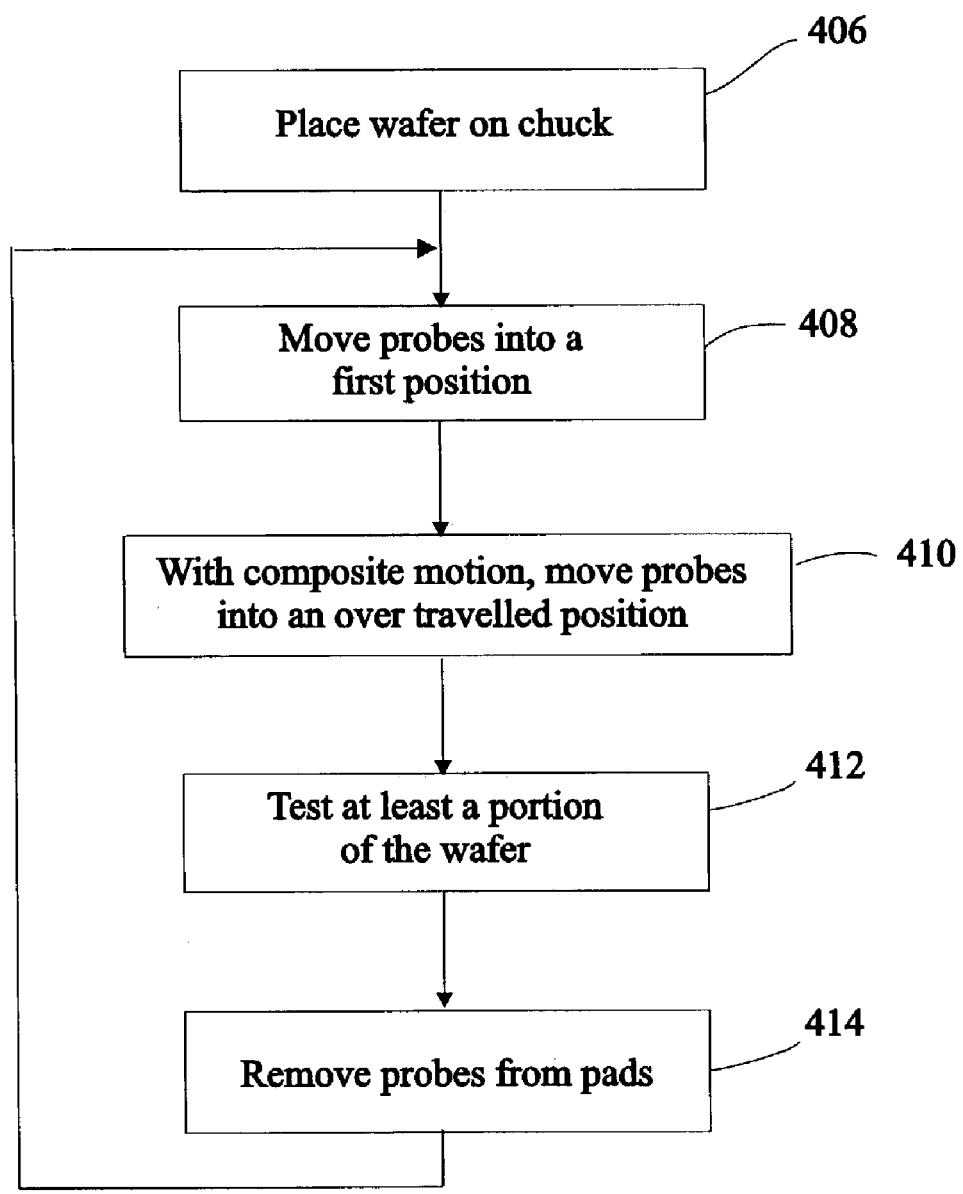
FIG. 12 illustrates an exemplary process for probing a semiconductor device.

FIG. 12 illustrates an exemplary process for testing production wafers 524 using the exemplary test system 500 of FIG. 4. As shown in FIG. 12, a production wafer 524 to be tested is placed on chuck 514 (step 406), and the chuck moves the wafer such that terminals on the wafer are brought into a first position with respect to probes 508 (step 408). As one example, this first position may be first contact between the probes 508 and the terminals. As another example, the first position may be a position in which the tips of probes 508 are located a specified distance directly above the terminals. How these steps are performed is not critical to the invention; indeed, these steps may be performed in any manner using any means. For example, after the production wafer 524 is placed on the chuck 514, the chuck may be moved such that selected terminals on wafer 524 are directly below selected probes 508, after which the chuck may move the wafer upward until first contact is made between the selected terminals and at least one of the selected probes. First contact may be determined using known electrical apparatus for sensing contact between one or more probes 508 and one or more terminals. As another example, first contact may be determined using cameras 522.

As shown in step 410, the controller 530 then moves the chuck 514 so that wafer 524 moves from the first position described above into an over travel position. As described above, over travel involves moving wafer 524 a vertical distance past first contact with probes 508, compressing probes 508 to form reasonably low resistance electrical connections between probes 508 and terminals on wafer 524. In the case of the present invention, this movement into the over travel position includes not only a vertical movement component but a horizontal movement component as well. That is, in moving from the first position to the over travel position, the chuck is moved in accordance with the composite movement determined in step 402 and set during step 404 as described above. As described above, this composite movement includes at least two components: one component is "z" direction movement of the wafer 524 toward probe card 506. Another component of this composite motion is the horizontal movement determined at step 402. Such movement may be controlled by controller 530. For example, as described above, microprocessor may execute software stored in digital memory 532 and output movement control signals through input/output port 538 to control movement of chuck 514.

It should be noted that the composite motion of step 410 may be followed by a purely horizontal motion or a purely vertical motion or some other type of motion. For example, a purely horizontal motion may be used to ensure a minimum amount of wipe by the probe across the terminal. As another example, a purely vertical motion may be implemented to ensure that a relatively high force connection is established between the probes and the wafer.

Figure 13A:
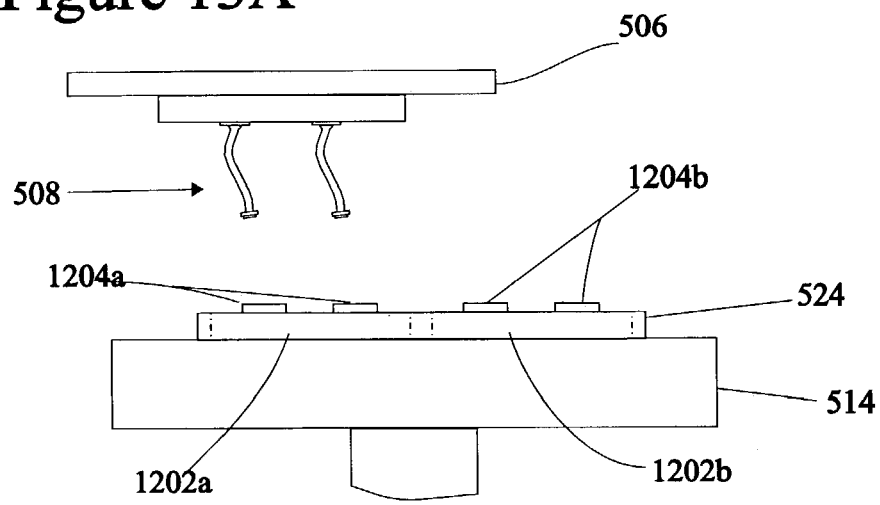
FIGS. 13A–13C illustrate an exemplary application of steps 406–410 of FIG. 12.
Figure 13B:
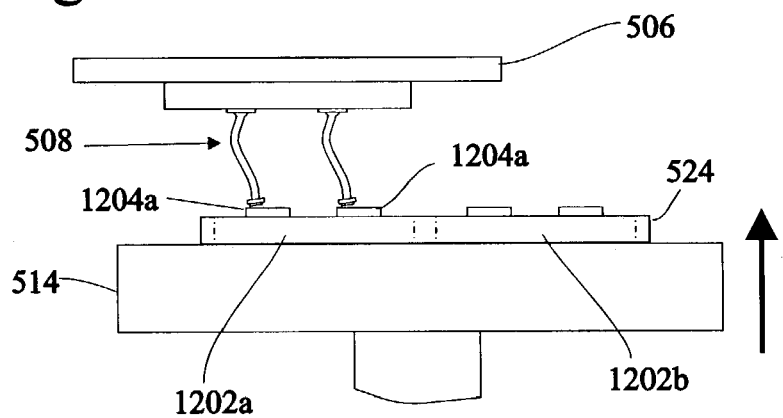
Figure 13C:
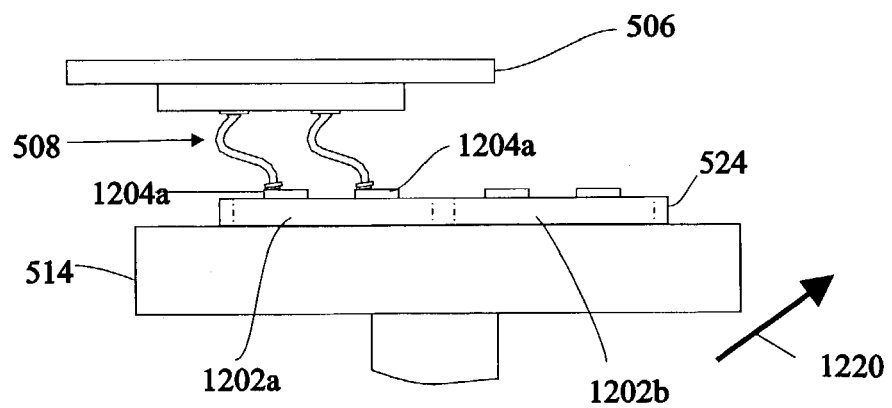

FIGS. 13A–13C illustrate one exemplary application of steps 406–410 of FIG. 12. As shown in FIG. 13A, a production wafer 524 is placed on chuck 514 (step 406). In this example, chuck 514 aligns selected terminals 1204a on wafer 524 with probes 508 and moves the selected terminals 1204a into first contact with the ends of probes 508 (step 408), as shown in FIG. 13B. From first contact between the terminals 1204a and the probes 508, chuck 514 then moves into an over travel position using a composite movement 1220 that includes both a vertical and horizontal component, as shown in FIG. 13C (corresponding to step 410 of FIG. 12). As discussed above, the length of the vertical component is the amount of vertical over travel desired for making reasonably good electrical connections between probes 508 and terminals 204. The horizontal component is in the direction and for a length as determined at step 402 of FIG. 5 and as programmed into the controller 530 at step 404 of FIG. 5.

Figure 14A:
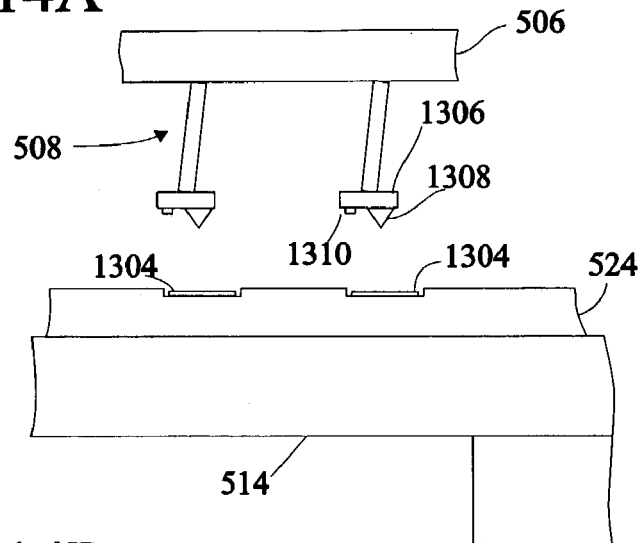
FIGS. 14A–14C illustrate another exemplary application of steps 406–410 of FIG. 12.
Figure 14B:
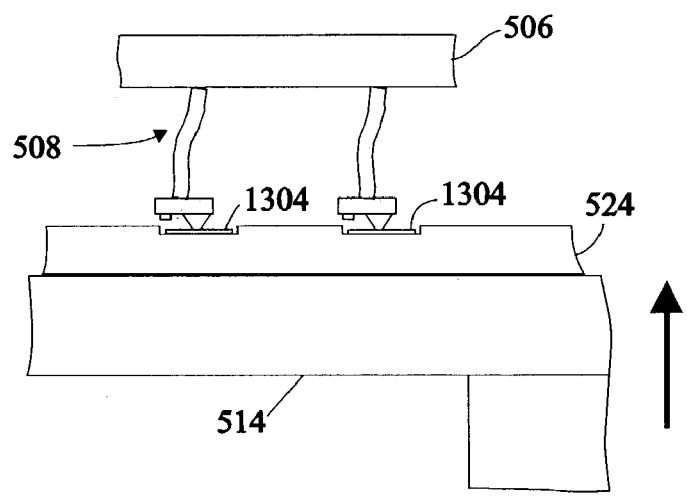
Figure 14C:
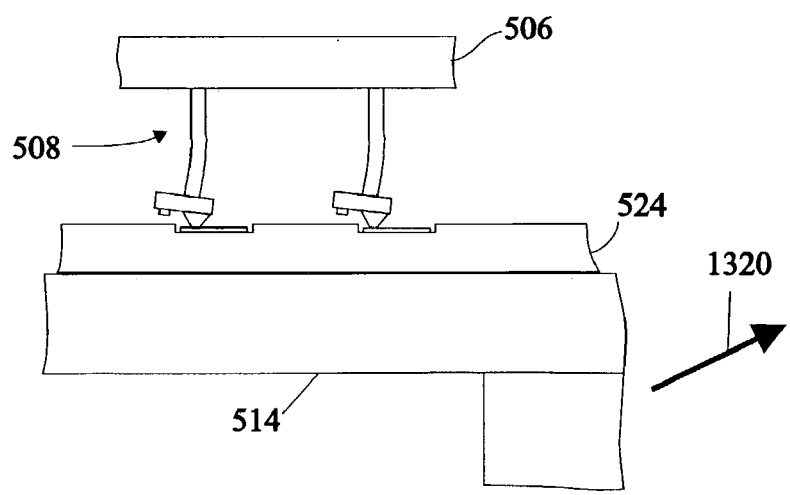

FIGS. 14A–14C illustrate another exemplary application of steps 406–410 of FIG. 12. As shown in FIG. 14A, a production wafer 524 is placed on chuck 514 (step 406). In this example, production wafer 524 includes terminals 1304 that are recessed below the surface of wafer 524. Chuck 514 then aligns selected terminals 1304 on wafer 524 with probes 508 and moves the selected terminals 1304 into a first position with respect to the probes 508 (step 408), as shown in FIG. 14B. It should be noted that the exemplary probes 508 include a probe paddle 1206 with an alignment feature that may be used to align the probes 508 with the terminals 1304. Cameras 522 may use, among other things, alignment marks 1310 as an aid in aligning probes 508 with terminals 1304. Formation and use of such alignment marks are described in detail in pending U.S. patent application Ser. No. 09/906,999, filed Jul. 16, 2001, which is incorporated by reference herein in its entirety. In this example, the first position is first contact between terminals 1304 and the tip of probes 508 plus a small amount of over travel that causes the tips of probes 508 to penetrate oxide or other contaminates on the surface of terminals 1304.

From this first position, chuck 514 then moves the wafer 524 into a further over travel position mentioned at step 410 of FIG. 12 using a composite movement 1320 that includes both a vertical and horizontal component, as shown in FIG. 14C. The length of the vertical component is the amount of further vertical over travel desired for making reasonably good electrical connections between probes 508 and terminals 1304. The horizontal component is in the direction and for a length as determined at step 402 of FIG. 5 and as programmed into the controller 530 at step 404 of FIG. 5.

Returning again to FIG. 12, with the terminals of wafer 524 brought into contact and over traveled with respect to the probes 508 (following steps 408 and 410), test signals are provided to the terminals and response data generated by the die or dice to which the terminals are attached are monitored at step 412. For example, such test signals may be generated by a tester 502. Once the testing is completed, the controller 530 causes the chuck to move the wafer 524 away from the probes 508 at step 414. The path or directions of this movement are not critical. Nonlimiting examples of suitable paths include the reverse of the movement used to bring the wafer 524 into contact with the probes 508, and simply moving the wafer in the "z" direction away from the probes. Controller 530 may be configured to move the wafer 524 away from probes 508 using any of these or other ways, and controller 530 may do so by executing software and issuing control signals that control movement of chuck 514. Steps 408–414 may then be repeated until all or at least a portion of the dice on the wafer 524 have been tested.

Figure 15:
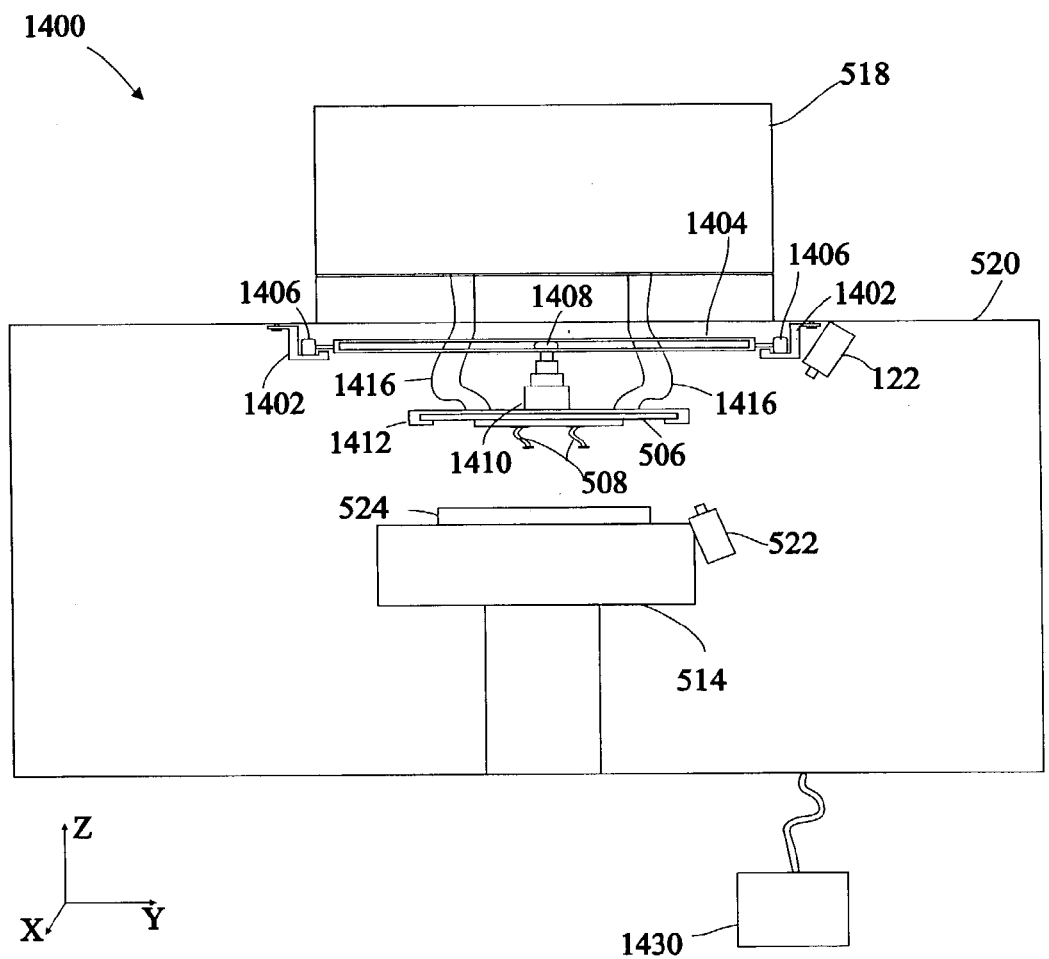
FIG. 15 illustrates another exemplary test system in which a process embodying the present invention may be implemented.

FIG. 15 shows an exemplary test system 1400 in which probe card 506 is capable of movement in at least one of the "x," "y," and "z" directions. Of course, movement could be allowed in only one of those directions or only in a combination of two of those directions. (As with FIG. 4 above, directions in FIG. 15 are identified using an "x," "y," and "z" coordinate system in which the "z" direction is the vertical (up or down) with respect to FIG. 15, the "x" direction is horizontally into or out of the page, and the "y" direction is also horizontal but to the right or left in FIG. 15. These directions are for convenience purposes, however, and not by way of limitation.)

The exemplary test system 1400 shown in FIG. 15 may be generally similar to the test system 500 illustrated in FIG. 4. The exemplary test system 1400 shown in FIG. 14, however, includes a first track 1404 to which the probe card 506 is attached with roller 1408, allowing the probe card 506 to move in the "y" direction shown in FIG. 15. Tracks 1402 and rollers 1406 allow the probe card 506 to move in the "x" direction, and telescoping actuator 1410 allows the probe card 506 to move in the "z" direction. Motors (not shown) or other actuators (not shown) are controlled by control lines 1416, causing such movements of the probe card. Controller 1430 may be generally similar to controller 530 illustrated in FIG. 4 but modified to issue control signals that move both the chuck 514 and the probe card 506. Of course, the chuck 514 could be held stationary and only the probe card 506 moved. Modified to include movement of the probe card 506, the exemplary process illustrated in FIG. 4 may otherwise be implemented in a system like that shown in FIG. 15.

Although the above discussion focuses on reducing stress and forces in the probes and on the wafer, the invention is not so limited. Rather, there are other applications for the present invention. For example, a horizontal movement component may be added to the vertical over travel movement simply to alter the natural wiping motion of a probe. As one example, probes that are vertical (that is, perpendicular to the surface of the probe card assembly to which they are attached) tend not to wipe when brought into contact with a terminal and over traveled in a vertical direction. Adding a horizontal movement component is one way of causing a vertical probe to wipe. As another example, although a nearly vertical probe may have some natural wipe, the length of the natural wipe will be short. Adding a horizontal movement component that is in the direction of the natural wipe is one way of increasing the natural wipe of such a probe. As yet another example, where a probe is to wipe a small pad and the probe's natural wipe would cause the probe to wipe off of the pad, a horizontal movement opposite the natural direction of a probe's wiping motion may be added to reduce the natural length of the wipe, keeping the probe on the pad. Other examples are possible.

Figure 17:
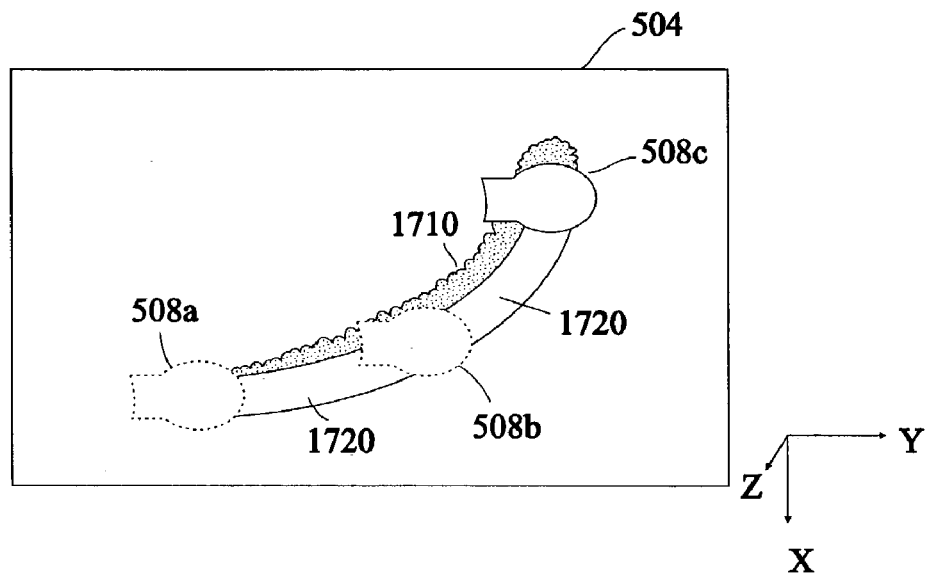
FIGS. 17 and 18 illustrate exemplary wiping paths that wipe away from such debris.
Figure 18:
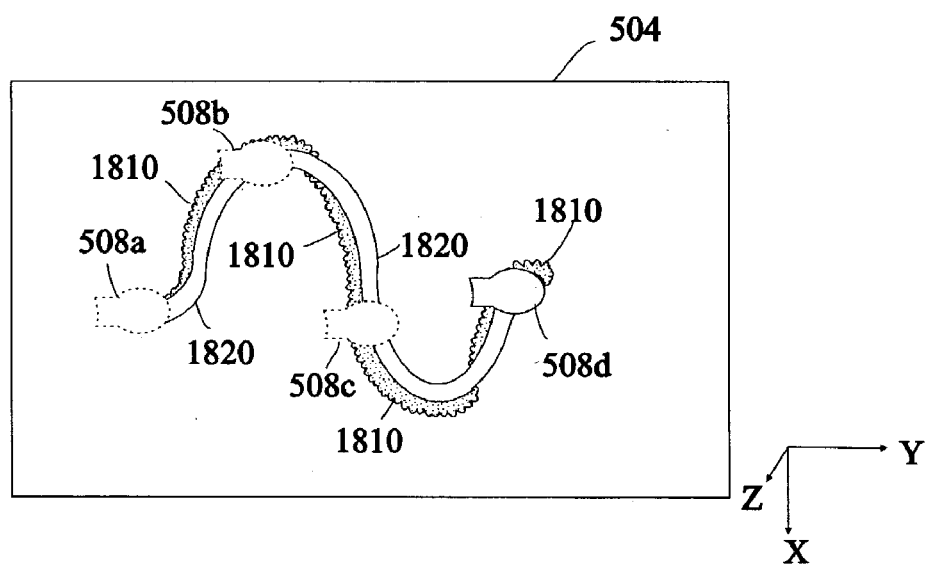

FIGS. 17 and 18 illustrate yet another such application of the invention. (The directions labeled "x," "y," and "z" are as in FIGS. 1 and 4, but again are for reference purposes only and are not to be taken as limiting.)

Figure 2A:
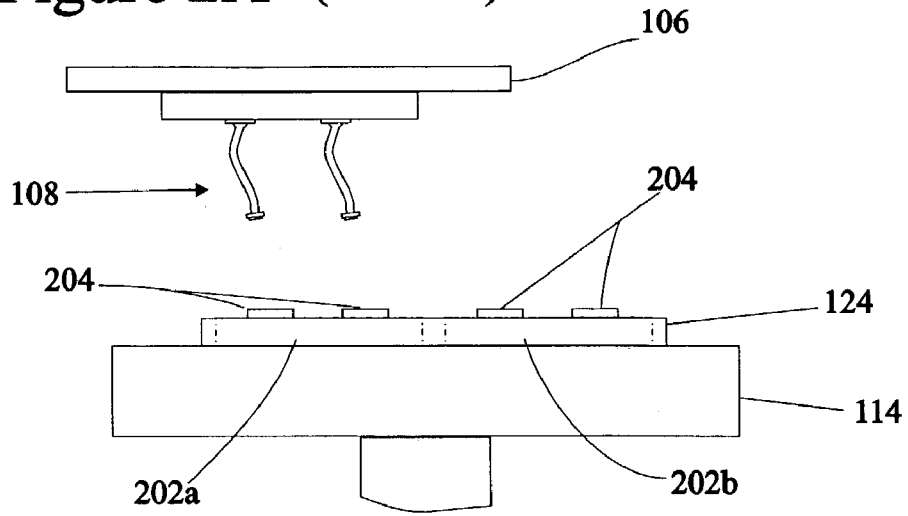
FIGS. 2A–2C illustrate operation a portion of the exemplary test system illustrated in FIG. 1.
Figure 2B:
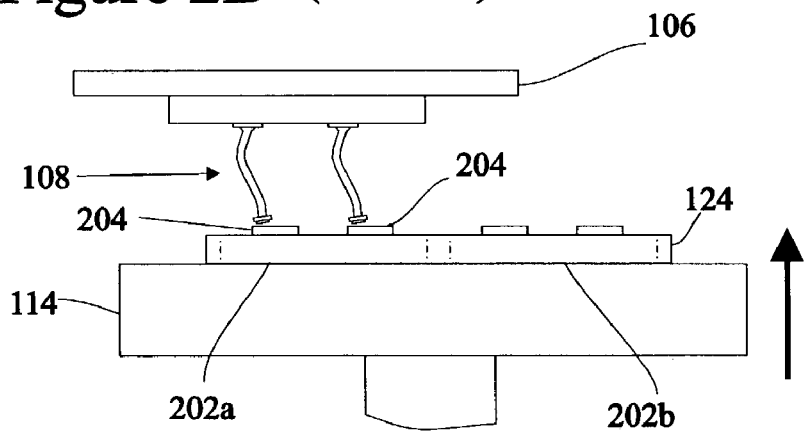
Figure 2C:
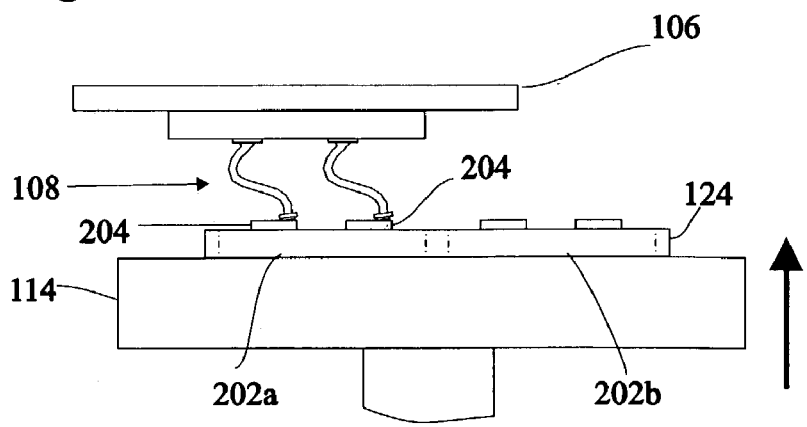
Figure 3A:
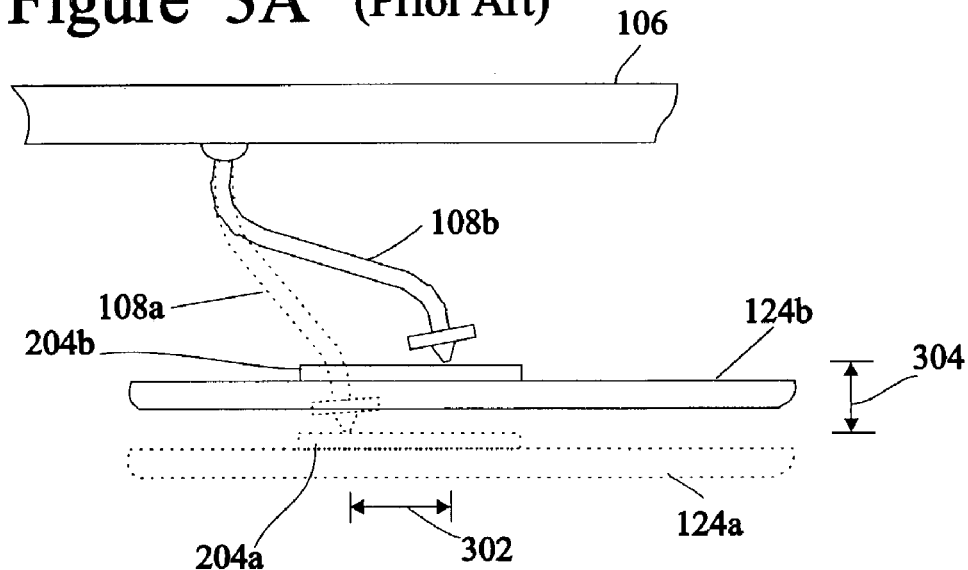
FIGS. 3A–3C illustrate compression of a probe during the operation illustrated in FIGS. 2A–2C.
Figure 3B:
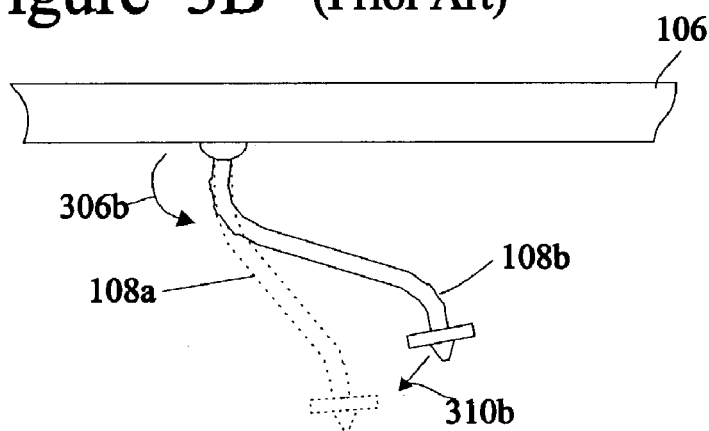
Figure 3C:
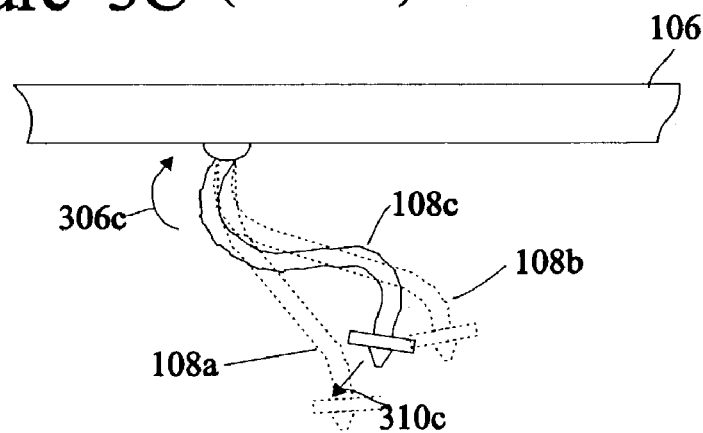
Figure 16A:
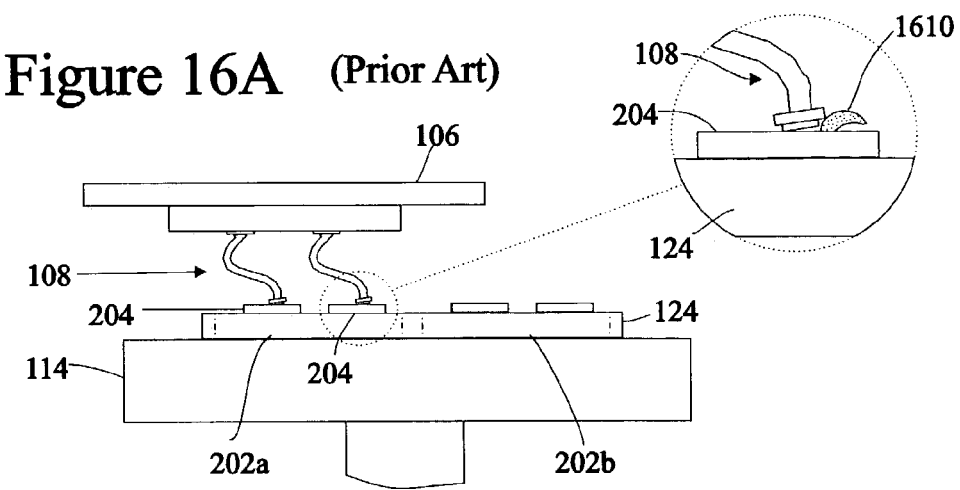
FIGS. 16A and 16B illustrate the build up of debris in the wiping path of a probe.
Figure 16B:
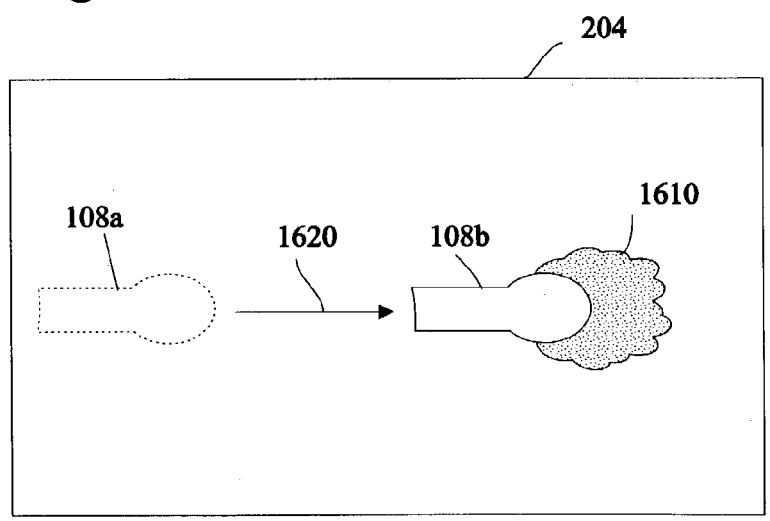

Referring first to FIGS. 16A and 16B, FIG. 16A shows the chuck 114 and probe card 106 shown in FIG. 2C with a magnified illustration of one of terminals 204. As described above, FIG. 2C, and hence FIG. 16A, shows chuck 114 and probe card 106 after the chuck has moved wafer terminals 204 past first contact with probes 108 by a desired amount of over travel, compressing probes 108 and causing the probes to wipe across terminals 204. As probe 108 wipes across terminal 204, the probe typically cuts a small trench (not shown). As shown in FIG. 16B (which is top view of terminal 204), debris 1610 from the trench may pile up in front of the probe 108. The magnified portion of FIG. 16A illustrates debris 1610 that has been plowed up by probe 108. FIG. 16B illustrates probe's 108 wipe from an initial contact position 108a along wiping path 1620 to a final position 108b, with debris 1610 accumulated in front of probe 108. Some of such debris may stick to the probes, which must then be periodically cleaned. Such debris may also increase the forces or stresses on the probe and/or the wafer.

FIGS. 17 and 18, which also illustrate top views of a wafer terminal 504, show addition of an exemplary horizontal (e.g., in the "x, y" plane) movement to the otherwise vertical ("z" direction) over travel movement of the chuck 514 (see FIG. 4) for the purpose of achieving a wiping action that moves toward the freshly cut face of a small trench 1720 cut into the surface of terminal 504 by the wiping action of probe 508. The arcing motion on the surface of terminal 504 is achieved by adding an arced motion in the "x, y" plane as the horizontal component of the composite motion of step 1006 (see FIG. 10). (As generally discussed above, a vertical over travel motion is another component of the composite motion of step 1006.) Thus, per step 1006 in FIG. 10, the chuck 514 (see FIG. 4) is moved both vertically in an amount of desired over travel and horizontally in the desired arc motion. As shown in FIG. 17, the result is an arc shaped wiping motion on the surface of terminal 504. (The probe 508 is shown in three positions 508a, 508b, 508c along its path of travel on the surface of terminal 504.) As can be seen, one beneficial result may be that the probe does not move directly into the pile up of debris 1710.

FIG. 18 illustrates another exemplary wiping motion, which, as shown, is zig-zag. Here, the horizontal component of the composite movement of step 1006 (see FIG. 10) is zig-zag (or oscillating) rather than an arc. Otherwise, FIG. 18 is generally similar to FIG. 17. Again, the probe 508 is shown in several positions 508a, 508b, 508c, 508d along its path of motion. As shown, the probe 508 cuts a small trench 1820 into the surface of terminal 504, but the zig-zag motion tends to keep the probe 504 from moving directly into the pile up of debris 1810.

It should be apparent that the paths 1720 and 1820 illustrated in FIGS. 17 and 18 are exemplary only. Many other paths are possible, including paths in which the probe is caused to move in a first direction along a wiping path and then move backward along the same wiping path. Also, the vertical component of the composite motion of step 1006 of FIG. 10 may be modified to modify the vertical (that is, "z") component of the overall motion of the probe 508. Thus, nearly any two or even three dimensional motion of the probe 508 with respect to the surface of the terminal 504 may be achieved.

Thus, step 402 of FIG. 5 may be modified to achieve purposes other than reducing stresses and forces. As discussed above, examples of other purposes include modifying the wiping action of a probe, for example, to obtain a desired length of wipe of a probe across a terminal or to move a probe in a direction other than directly into a pile up of debris caused by the wiping.

Although the principles of the present invention have been illustrated and explained in the context of specific embodiments, it will be appreciated by those having skill in the art that various modifications beyond those illustrated can be made to the disclosed embodiments without departing from the principles of the present invention. For example, although the foregoing exemplary embodiments show application of the invention to a prober for probing semiconductor wafers, the invention is equally applicable to any testing of an electronic device in which probes are brought into contact with terminals or other contact points or features on the electronic device for the purpose of testing the electronic device. Examples of the foregoing include sockets and test probes for packaged or unpackaged semiconductor devices, including singulated semiconductor dice. As another example, the foregoing descriptions refer to the components of the composite motion as "vertical" and "horizontal" movement components. The terms "vertical" and "horizontal" are relative, and other directional components may be used instead. As yet another example, the horizontal movement component may include movements other than linear movement. For example, the horizontal movement component may include a rotation in the horizontal (that is, "x, y") plane. These and other modifications to and departures from the disclosed embodiments are deemed to be within the scope of the following claims.

What is claimed is:

1. A method of testing a semiconductor device, said semiconductor device including a terminal, said method comprising:
   bringing said terminal and a test probe into contact one with another by a relative movement between said terminal and said test probe, said relative movement comprising:
      a first directional component that presses said test probe into said terminal, compressing said test probe and inducing a stress in at least one of said test probe or said semiconductor device sufficient to establish an electrical connection between the test probe and the terminal, and
      a second directional component that alters said stress; and
   providing test signals through said probe via the electrical connection to said semiconductor device.

2. The method of claim 1, wherein said probe is resilient.

3. The method of claim 1, wherein said semiconductor device is an unsingulated wafer.

4. The method of claim 1, wherein said second directional component tends to reduce said stress.

5. The method of claim 4, wherein said stress is in said test probe.

6. The method of claim 4, wherein said stress is in said semiconductor device.

7. The method of claim 1, wherein a length of movement in said second directional component is a function of a length of movement in said first directional component.

8. The method of claim 1, wherein:
   said terminal is disposed on a surface of said semiconductor device,
   said first directional component is perpendicular to said surface, and
   said second directional component is parallel to said surface.

9. The method of claim 1, wherein said providing test signals comprises providing said test signals through said probe and said terminal, which is electrically connected to electrical circuitry integrated into said semiconductor device.

10. A method of testing a semiconductor device, said semiconductor device including a terminal electrically connected to electrical circuitry integrated into said semiconductor device, said method comprising:

effecting relative movement between said terminal and a test probe, said relative movement comprising:
  a first directional component that tends to induce a contact force between said test probe and said terminal, and
  a second directional component that tends to reduce said force; and
providing test signals through said probe and said terminal to said electrical circuitry integrated into said semiconductor device.

11. The method of claim 10, wherein said effecting relative movement brings said terminal and said test probe into contact one with another.

12. A method of testing a semiconductor device, said semiconductor device including a plurality of terminals providing power input and signal input into and signal output from circuitry integrated into the semiconductor device, said method comprising:
effecting relative movement between said terminals and a plurality of test probes, said relative movement comprising:
  a first directional component that tends to over travel contact between said terminals and said test probe, said over travel inducing stresses in at least one of said test terminals or said semiconductor device, and
  a second directional component that tends to reduce said stresses; and
providing power and test signals through ones of said probes to ones of said terminals of said semiconductor device.

13. The method of claim 12, wherein said over travel in said first directional component tends to urge said test probes to wipe said terminals, said wiping inducing said stresses.

14. The method of claim 13, wherein said second directional component is in a direction of said wiping.

15. The method of claim 14 further comprising, prior to said effecting relative movement, determining a direction of said wiping.

16. The method of claim 15, wherein said determining a direction of said wiping comprises analyzing compression of said probes caused by said over travel.

17. The method of claim 15, further comprising, prior to said effecting relative movement, determining a length of said wiping.

18. The method of claim 17, wherein said second directional component is of a length less than said length of said wiping.

19. The method of claim 12, wherein said over travel in said first directional component tends to cause said test probes to dig into said terminals, inducing said stresses.

20. The method of claim 12, wherein said stresses are contact forces between said test probes and said terminals.

21. The method of claim 12, wherein:
said terminals are disposed on a surface of said semiconductor device,
said first directional component is perpendicular to said surface, and
said second directional component is parallel to said surface.

22. The method of claim 12, wherein said effecting relative movement brings said terminals and said test probes into contact one with another.

23. A probe card for probing a semiconductor device, said probe card comprising:
a substrate; and
a plurality of probes attached to a surface of said substrate and configured to make electrical connections with a plurality of terminals providing power input and signal input into and signal output from circuitry integrated into a semiconductor device upon movement pressing said probes and said terminals of said semiconductor device into each other, said movement comprising:
  a first directional component that is perpendicular to said surface of said substrate, and
  a second directional component that is parallel to said surface of said substrate.

* * * * *